United States Patent
Fan et al.

(10) Patent No.: US 11,205,590 B2
(45) Date of Patent: Dec. 21, 2021

(54) SELF-ALIGNED CONTACTS FOR MOL

(71) Applicant: International Business Machines Corporation, Armonk, NY (US)

(72) Inventors: Su Chen Fan, Cohoes, NY (US); Adra Carr, Los Alamos, NM (US); Ruilong Xie, Niskayuna, NY (US); Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 68 days.

(21) Appl. No.: 16/578,300

(22) Filed: Sep. 21, 2019

(65) Prior Publication Data

US 2021/0090950 A1 Mar. 25, 2021

(51) Int. Cl.
*H01L 21/768* (2006.01)
*H01L 23/532* (2006.01)
*H01L 23/522* (2006.01)

(52) U.S. Cl.
CPC .. *H01L 21/76897* (2013.01); *H01L 21/76816* (2013.01); *H01L 21/76834* (2013.01); *H01L 23/5226* (2013.01); *H01L 23/53238* (2013.01); *H01L 23/53266* (2013.01)

(58) Field of Classification Search
CPC ......... H01L 21/76897; H01L 21/76816; H01L 21/76834; H01L 23/5226; H01L 23/53238; H01L 23/53266
See application file for complete search history.

(56) References Cited

U.S. PATENT DOCUMENTS

| | | |
|---|---|---|
| 5,939,749 A | 8/1999 | Taketa et al. |
| 9,412,648 B1 | 8/2016 | Shiu et al. |
| 9,412,840 B1 | 8/2016 | Leobandung et al. |
| 9,437,714 B1 | 9/2016 | Adusumilli et al. |
| 9,461,143 B2 | 10/2016 | Pethe et al. |
| 9,508,825 B1* | 11/2016 | Basker .............. H01L 21/76831 |
| 9,741,609 B1 | 8/2017 | Cheng et al. |
| 9,818,876 B1 | 11/2017 | Bouche |
| 9,923,078 B2 | 3/2018 | Greene et al. |
| 10,204,828 B1 | 2/2019 | Bao et al. |
| 2004/0038517 A1* | 2/2004 | Kang ................ H01L 21/76843 438/630 |
| 2005/0020086 A1 | 1/2005 | Kim et al. |
| 2005/0087776 A1 | 4/2005 | Kim |

(Continued)

*Primary Examiner* — Christine A Enad
(74) *Attorney, Agent, or Firm* — Erik Johnson; Michael J. Chang, LLC

(57) ABSTRACT

MOL non-SAC structures and techniques for formation thereof are provided. In one aspect, a method of forming a semiconductor device includes: patterning fins in a substrate; forming gates over the fins and source/drains offset by gate spacers; lining upper sidewalls of the gates with a first dielectric liner; depositing a source/drain metal; lining upper sidewalls of the source/drain metal with a second dielectric liner; depositing a dielectric over the gates and source/drains; forming a first via in the dielectric which exposes the second dielectric liner over a select source/drain; removing the second dielectric liner from the select source/drain; forming a second via in the dielectric which exposes the first dielectric liner over a select gate; removing the first dielectric liner from the select gate; forming a source/drain contact in the first via; and forming a gate contact in the second via. A semiconductor device is also provided.

8 Claims, 15 Drawing Sheets

(56) References Cited

U.S. PATENT DOCUMENTS

| | | |
|---|---|---|
| 2007/0096185 A1 | 5/2007 | Kim et al. |
| 2017/0062413 A1* | 3/2017 | Basker ................ H01L 21/8234 |
| 2017/0077256 A1 | 3/2017 | Adusumilli et al. |
| 2017/0170320 A1* | 6/2017 | Chang ............... H01L 29/66545 |
| 2018/0138176 A1* | 5/2018 | Shen ............... H01L 21/823431 |
| 2019/0035917 A1 | 1/2019 | Cheng et al. |

* cited by examiner

SELF-ALIGNED CONTACTS FOR MOL

FIELD OF THE INVENTION

The present invention relates to contact structures, and more particularly, to middle-of-line (MOL) non-self-aligned contact (non-SAC) structures and techniques for formation thereof that are compatible with gate contact over active area design layouts.

BACKGROUND OF THE INVENTION

A self-aligned contact (SAC) process for semiconductor device fabrication involves first placing a dielectric cap over device structures such as the gates. The cap serves as an isolation layer. In that case, source and drain contacts can be formed that also land directly on the gates without shorting concerns since the gate is isolated by the cap.

There is, however, a trend towards non-SAC middle-of-line (MOL) designs since non-SAC MOL increases efficiency and output since there is no need for complex modules involving SAC cap formation and self-aligned contact etch. Thus, non-SAC MOL processes can lower production costs.

However, there are two fundamental challenges associated with this non-SAC structure. First, as the gate pitch is further scaled, gate-to-source/drain shorts become an increasing concern. Second, conventional non-SAC MOL structures are not compatible with gate contact over active area design layouts.

Thus, improved non-SAC MOL structures that are compatible with gate contact over active area design layouts would be desirable.

SUMMARY OF THE INVENTION

The present invention provides middle-of-line (MOL) non-self-aligned contact (non-SAC) structures and techniques for formation thereof that are compatible with gate contact over active area design layouts. In one aspect of the invention, a method of forming a semiconductor device is provided. The method includes: patterning fins in a substrate; forming: i) gates over the fins, and ii) source and drains on opposite sides of the gates, offset from the gates by gate spacers; lining upper sidewalls of the gates with a first dielectric liner; depositing a source and drain metal over the source and drains; lining upper sidewalls of the source and drain metal with a second dielectric liner; depositing a dielectric over the gates and the source and drains; forming a first contact via in the dielectric which exposes the second dielectric liner over a select source and drain; removing the second dielectric liner from the select source and drain through the first contact via; forming a second contact via in the dielectric which exposes the first dielectric liner over a select gate; removing the first dielectric liner from the select gate through the second contact via; forming a source and drain contact in the first contact via; and forming a gate contact in the second contact via.

In another aspect of the invention, another method of forming a semiconductor device is provided. The method includes: patterning fins in a substrate; forming: i) gates over the fins, and ii) source and drains on opposite sides of the gates, offset from the gates by gate spacers; recessing the gates which forms first gaps between the gate spacers at tops of the gates; forming a first dielectric liner along exposed sidewalls of the gate spacers in the first gaps; filling the first gaps between the first dielectric liner with a gate metal; depositing a source and drain metal over the source and drains; recessing the source and drain metal which forms second gaps between the gate spacers at tops of the source and drains; forming a second dielectric liner along exposed sidewalls of the gate spacers in the second gaps; filling the second gaps between the second dielectric liner with the source and drain metal; depositing a dielectric over the gates and the source and drains; forming a first contact via in the dielectric which exposes the second dielectric liner over a select source and drain; removing the second dielectric liner from the select source and drain through the first contact via; forming a second contact via in the dielectric which exposes the first dielectric liner over a select gate; removing the first dielectric liner from the select gate through the second contact via; forming a source and drain contact in the first contact via; and forming a gate contact in the second contact via.

In yet another aspect of the invention, a semiconductor device is provided. The semiconductor device includes: fins patterned in a substrate; gates formed over the fins; source and drains formed on opposite sides of the gates, offset from the gates by gate spacers; a source and drain metal disposed over the source and drains; a first dielectric liner along upper sidewalls of the gates; a second dielectric liner along upper sidewalls of the source and drain metal; a dielectric disposed over the gates and the source and drains; a first contact via in the dielectric over a select source and drain; a source and drain contact formed in the first contact via, wherein the source and drain contact wraps around the upper sidewalls of the source and drain metal over the select source and drain; a second contact via in the dielectric over a select gate; and a gate contact formed in the second contact via, wherein the gate contact wraps around the upper sidewalls of the select gate.

A more complete understanding of the present invention, as well as further features and advantages of the present invention, will be obtained by reference to the following detailed description and drawings.

DETAILED DESCRIPTION OF PREFERRED EMBODIMENTS

Provided herein are non-self-aligned contact (SAC), middle-of-line (MOL) structures and techniques for formation thereof that are compatible with gate contact over active area design layouts. As will be described in detail below, the present techniques involve selectively placing dielectric liners along the upper sidewalls of the gate and source/drain metal to enable the formation of gate and source/drain contacts without the risk of shorting to the adjacent structure. Advantageously, the gate contacts can be formed over the active area.

Figure 1:
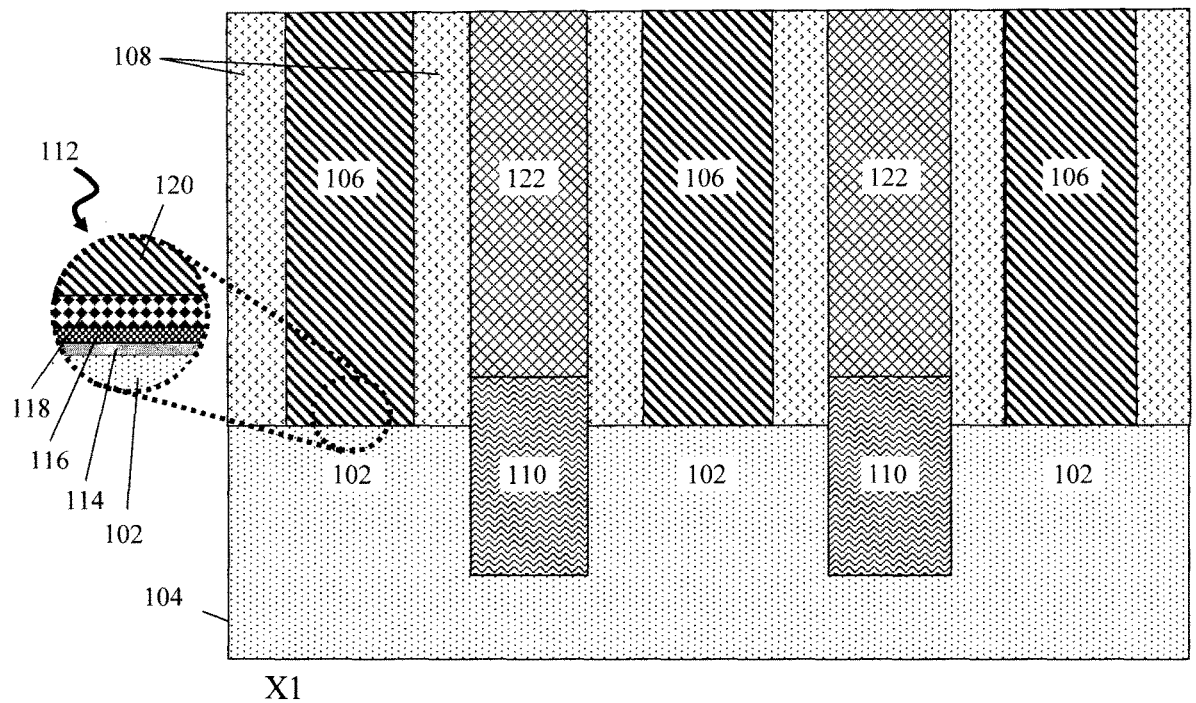
FIG. 1 is a cross-sectional diagram illustrating fins having been patterned in a substrate, gates having been formed over the fins, source and drains having been formed on opposite sides of the gates that are offset from the gates by gate spacers, and the gaps between the gates/gate spacers having been filled with an interlayer dielectric (ILD) over the source and drains according to an embodiment of the present invention.

An exemplary methodology for forming a semiconductor device in accordance with the present techniques is now described by way of reference to FIGS. 1-16. As shown in FIG. 1, the process begins with the patterning of fins 102 in a substrate 104. According to an exemplary embodiment, substrate 104 is a bulk semiconductor wafer, such as a bulk silicon (Si), bulk germanium (Ge), bulk silicon germanium (SiGe) and/or bulk III-V semiconductor wafer. Alternatively, substrate 104 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Standard lithography and etching techniques are used to pattern the fins 102 in substrate 104. A directional (anisotropic) etching process such as reactive ion etching (RIE) can be employed for the fin etch.

Figure 2:
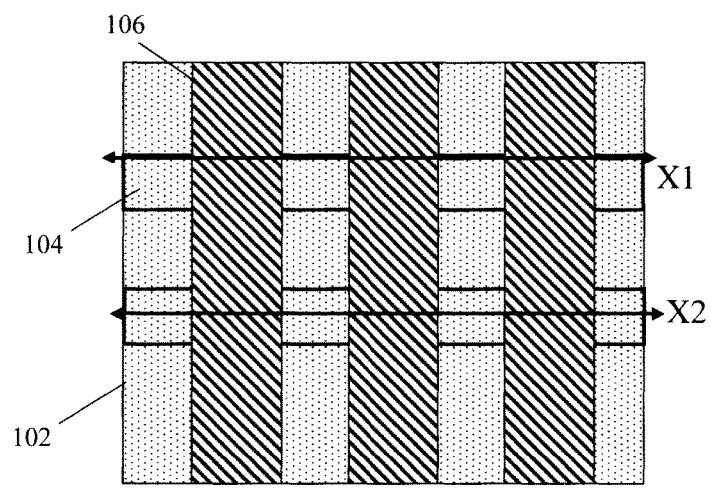
FIG. 2 is a top-down diagram illustrating an orientation of the various cross-sectional views of the device structure relative to the fins and gates according to an embodiment of the present invention.

In general, gates 106 will be formed over the fins 102, and source/drains 110 will be formed on opposite sides of the gates 106 that are offset from the gates 106 by gate spacers 108. See FIG. 1. For instance, referring briefly to FIG. 2 (a top-down view), gates 106 are formed over the fins 102. Gates 106 are formed as line that extend perpendicular to fins 102. FIG. 2 also illustrates the orientation of the various cross-sectional views of the device structure that will be presented in the following figures. For example, cross-sectional views X1 will depict a cut along a side of one of the fins 102 perpendicular to the gates 106, while cross-sectional views X2 will depict a cut along a center of one of the fins 102 perpendicular to the gates 106.

Referring back to FIG. 1 (a cross-sectional view X1), gates 106 can be formed using a variety of techniques known in the art such as gate-first or gate-last processes. With a gate-first process, the gate is formed at the beginning of the process. Doing so, however, exposes the gate components to potentially damaging conditions, such as elevated temperatures, experienced during fabrication. Of particular concern are high-κ gate dielectrics which can be damaged by exposure to elevated temperatures such as those experienced during source/drain formation. Thus, alternatively, a gate-last process enables the placement of the final gate structure at the end of the process thus avoiding the high temperature exposure. This gate-last process involves first forming sacrificial gates, e.g., of poly-Si and/or amorphous Si (not shown) and using those sacrificial gates to place the source/drains. Later on, the sacrificial gates are removed and replaced by the final gate structures (which are also referred to herein as 'replacement gates'). Gates 106 are generally representative of the gate structures formed using either a gate-first or a gate-last process.

According to one exemplary embodiment, gates 106 are high-κ metal gates formed using a gate-last process (also referred to herein as a 'replacement metal gate' or 'RMG' process). Doing so places the high-κ gate dielectric at the end of the process, thereby preventing its exposure to elevated temperatures during formation of source/drains 110. For instance, as shown in magnified view 112 in FIG. 1, each (RMG) gate 106 can include an interfacial oxide 114 formed on exposed surfaces of the fins 102, a high-κ gate dielectric 116 deposited on the fins 102 over the interfacial oxide 114, a workfunction-setting metal 118 deposited on the high-κ gate dielectric 116, and a low resistance fill metal 120 deposited on the workfunction-setting metal 118.

The interfacial oxide 114 (e.g., silicon dioxide ($SiO_2$) which may include other chemical elements in it such as nitrogen, germanium, etc.) can be formed selectively on exposed surfaces of the fins 102 by an oxidation process to a thickness of from about 0.3 nanometers (nm) to about 5 nm, and ranges therebetween, e.g., about 1 nm.

The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$) and/or lanthanum oxide ($La_2O_3$).

The particular workfunction-setting metal 118 employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Suitable low resistance fill metals 120 include, but are not limited to, tungsten (W) and/or copper (Cu).

Suitable materials for gate spacers 108 include, but are not limited to, oxide and nitride dielectric materials such as $SiO_2$, silicon oxycarbide (SiOC), silicon nitride (SiN), silicon borocarbonitride (SiBCN) and/or silicon oxycarbonitride (SiOCN). According to an exemplary embodiment, source/drains 110 are formed from an in-situ doped (i.e., during growth) or ex-situ doped (e.g., by ion implantation) epitaxial material such as epitaxial Si, epitaxial SiGe, etc. Suitable n-type dopants include, but are not limited to, phosphorous (P) and/or arsenic (As), and suitable p-type dopants include, but are not limited to, boron (B).

As shown in FIG. 1, the gaps between gates 106/gate spacers 108 are filled with an interlayer dielectric (ILD) 122 over source/drains 110, followed by planarization using a process such as chemical-mechanical polishing (CMP). Suitable ILDs 122 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Figure 3:
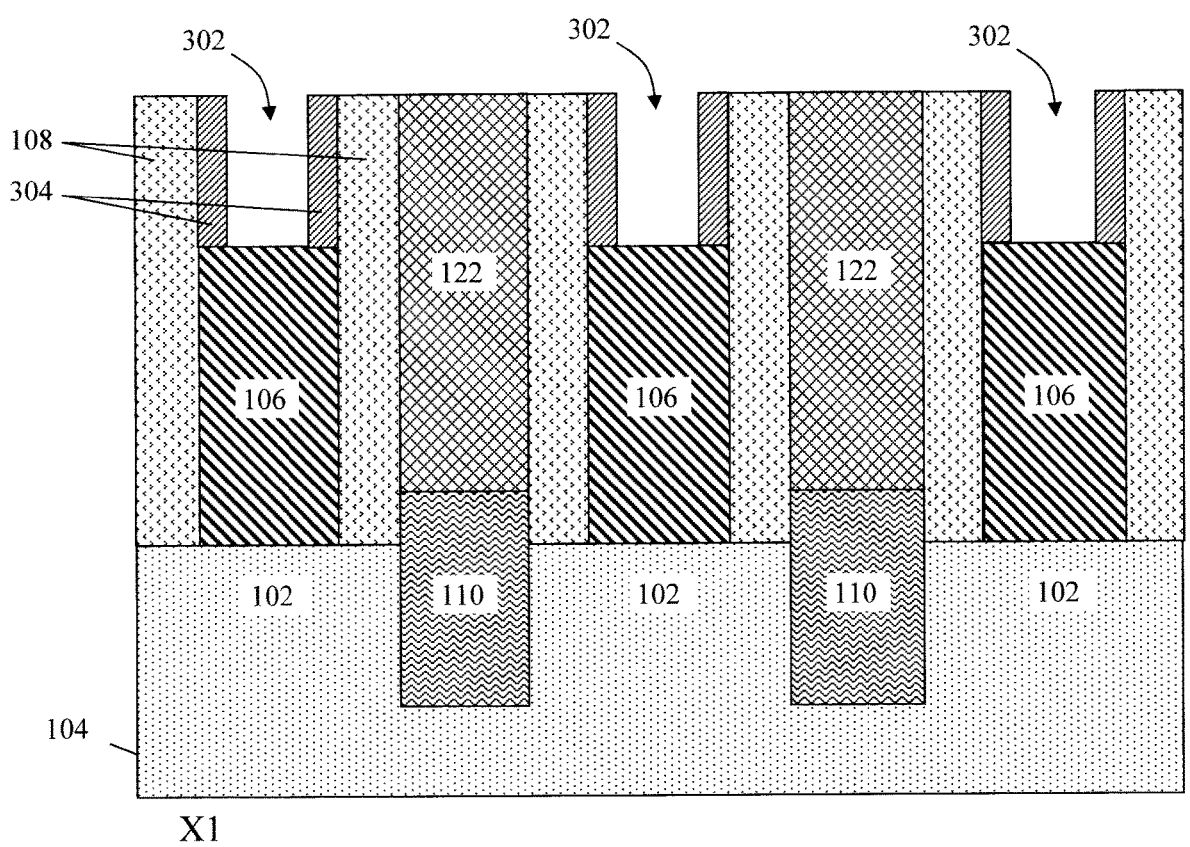
FIG. 3 is a cross-sectional diagram illustrating the gates having been recessed, forming (first) gaps between the gate spacers at the tops of the gates, and a (first) dielectric liner having been formed along the exposed sidewalls of the gate spacers in the first gaps according to an embodiment of the present invention.

As shown in FIG. 3 (a cross-sectional view X1), the gates 106 are then recessed, forming (first) gaps 302 between the gate spacers 108 at the tops of the gates 106. By way of example only, a fluorine-based plasma etching process can be used to etch gate metals such as tungsten (W) selective to the silicon-containing material(s) of gate spacers 108. A (first) dielectric liner 304 is then formed along the exposed sidewalls of gate spacers 108 in the gaps 302. See FIG. 3. According to an exemplary embodiment, dielectric liner 304 is formed by depositing a dielectric liner material into gaps 302, and then using a directional (anisotropic) etching process to pattern the material into the dielectric liner 304 along the sidewalls of gate spacers 108 in gaps 302. Suitable dielectric liner materials include, but are not limited to, $SiO_2$ and/or SiN. Preferably, a different material is used for dielectric liner 304 than for gate spacers 108. This will enable the removal of the dielectric liner 304 selective to the gate spacers 108 later on in the process. For instance, by way of a non-limiting example, use of SiOCN and/or SiBCN for gate spacers 108 and $SiO_2$ and/or SiN for dielectric liner 304 will enable removal of the dielectric liner 304 selective to the gate spacers 108.

Figure 4:
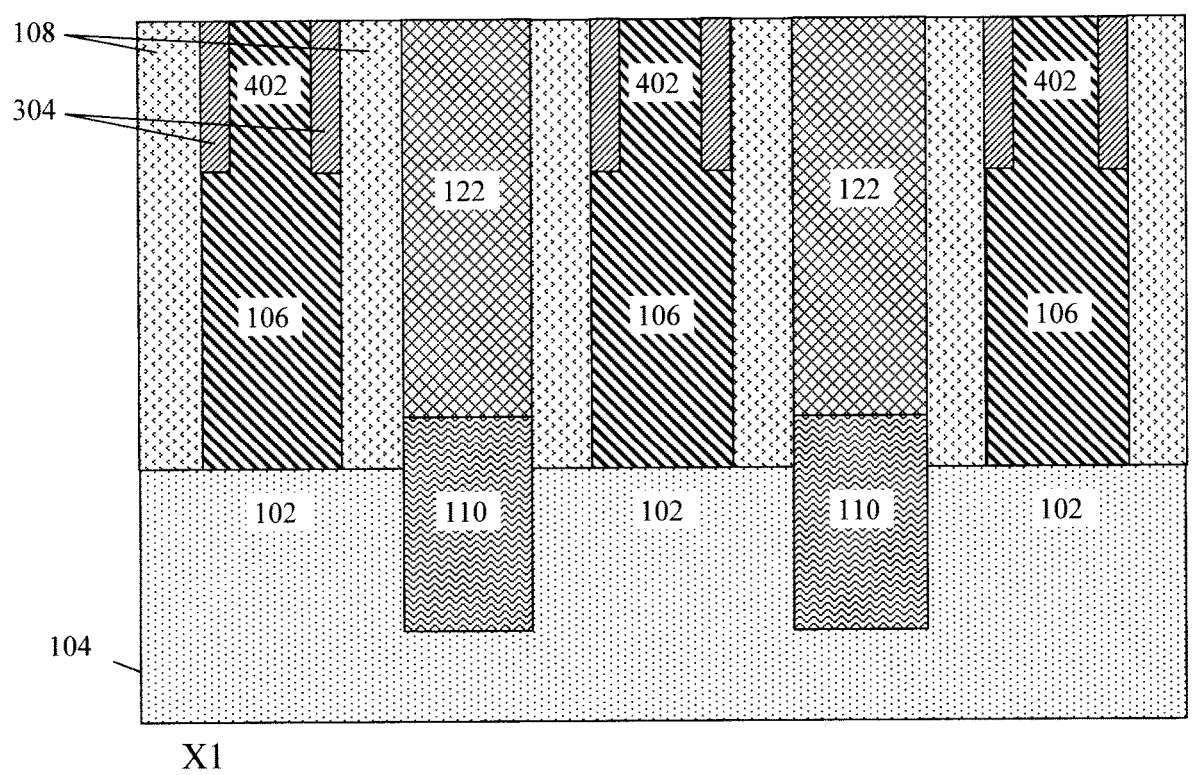
FIG. 4 is a cross-sectional diagram illustrating the first gaps between the first dielectric liner having been filled with a gate metal such that the first dielectric liner is now present lining the upper sidewalls of the gates according to an embodiment of the present invention.

As shown in FIG. 4 (a cross-sectional view X1), the gaps 302 between dielectric liner 304 are then filled with gate metal 402. According to an exemplary embodiment, gate metal 402 includes at least one metal in common with gates 106. For instance, to use an illustrative, non-limiting example, fill metal 120 of gates 106 and gate metal 402 can both include W and/or Cu. Gate metal 402 can be deposited/grown in gaps 302 using a process such as evaporation, sputtering, electrochemical plating, etc. The overburden is then removed using a process such as CMP. As a result, dielectric liner 304 is now present lining the upper sidewalls of gates 106 (formed by gate metal 402).

Figure 5:
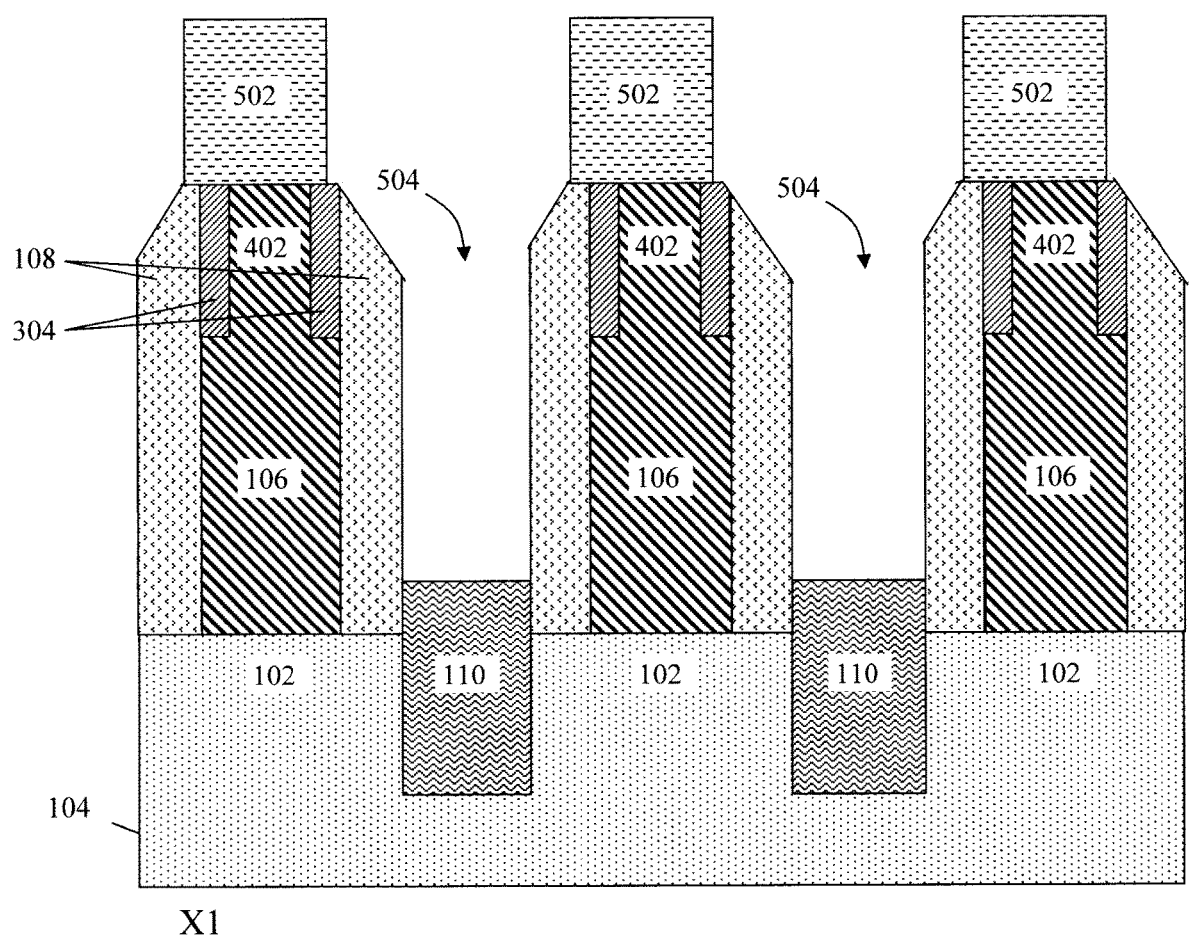
FIG. 5 is a cross-sectional diagram illustrating a mask having been patterned over the gates and gate metal, and the ILD having been selectively removed using the mask forming cavities over the source/drains according to an embodiment of the present invention.

As shown in FIG. 5 (a cross-sectional view X1), standard lithography and etching techniques are used to pattern a mask 502 over gates 106 and gate metal 402. According to an exemplary embodiment, mask 502 is formed from an organic planarizing layer (OPL) material commonly employed in a lithographic stack. As shown in FIG. 5, any slight misalignment of the mask 502 over gates 106 is inconsequential as the dielectric liner 304 protects the underlying gate metal 402.

A directional (anisotropic) etching process such as RIE is then used to selectively remove ILD 122 using mask 502, forming cavities 504 over the source/drains 110. See FIG. 5. For instance, to use an illustrative, non-limiting example, use of a nitride material such as SiOCN and/or SiBCN for gate spacers 108 and an oxide material such as SiOx, SiCOH and/or pSiCOH for ILD 122 will enable removal of ILD 122 selective to gate spacers 108 (e.g., using an oxide-selective RIE). As shown in FIG. 5, depending on the selectivity of the etch some tapering might occur at the tops of gate spacers 108. This tapering is, however, inconsequential as the tapering will be removed by polishing in a subsequent step.

Figure 6:
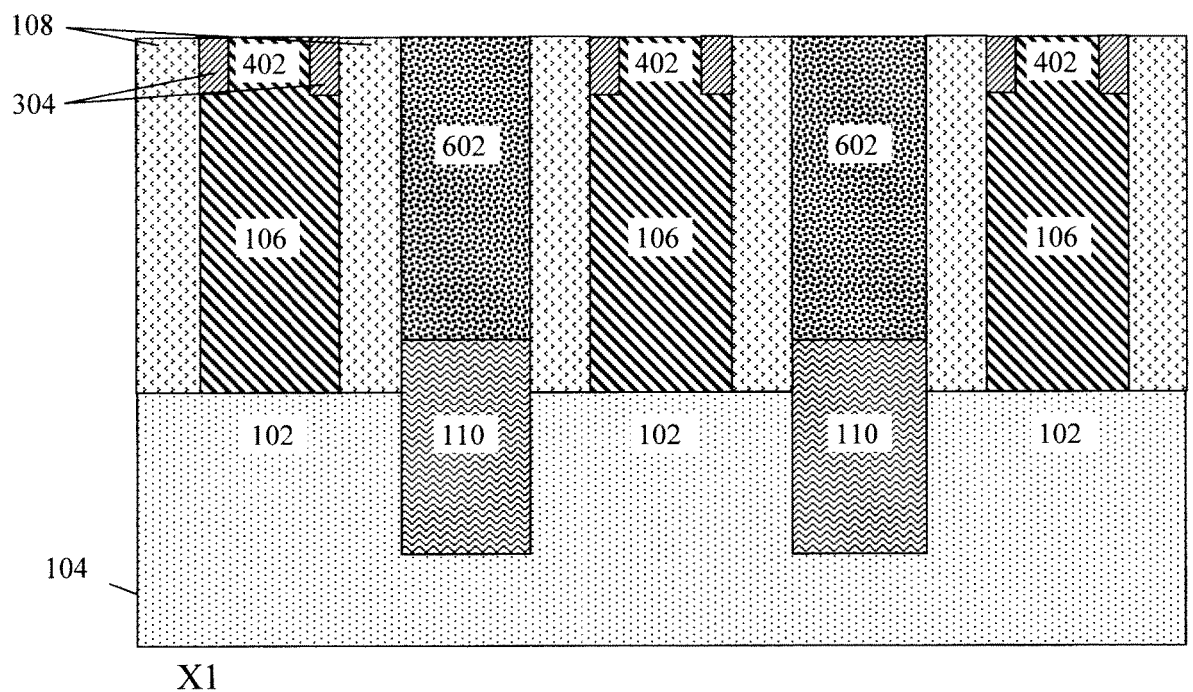
FIG. 6 is a cross-sectional diagram illustrating a source and drain metal having been deposited into the cavities over the source and drains according to an embodiment of the present invention.

Namely, as shown in FIG. 6 (a cross-sectional view X1), a source/drain metal 602 is next deposited into cavities 504 over the source/drains 110. Source/drain metal 602 can be deposited into cavities 504 using a process such as evaporation, sputtering, etc. Preferably, source/drain metal 602 is different from the metals used in gates 106. This will enable the source/drain metal 602 to be selectively recessed in a subsequent step. Suitable source/drain metals 602 include, but are not limited to, cobalt (Co) and/or ruthenium (Ru). Following this source/drain metallization, a polishing is performed, e.g., using CMP, to remove the overburden, along with any remaining mask 502. As provided above, this polishing also removes any tapering that might have occurred at the tops of gate spacers 108.

Figure 7:
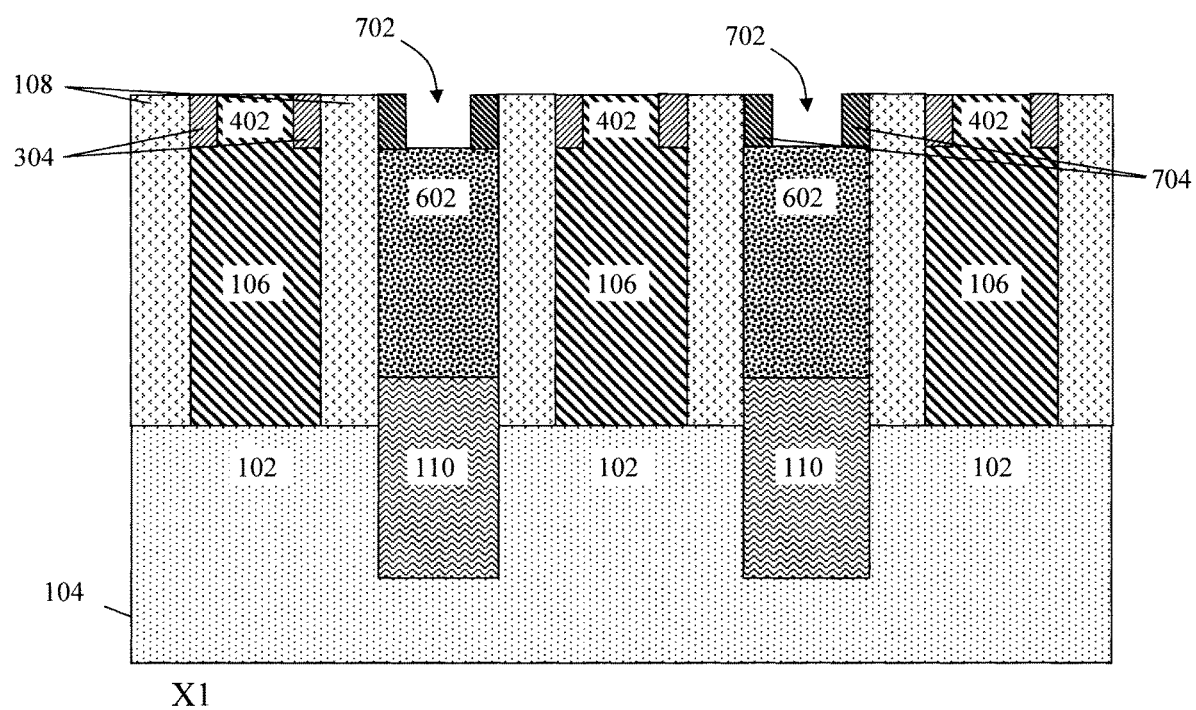
FIG. 7 is a cross-sectional diagram illustrating the source and drain metal having been recessed forming (second) gaps between the gate spacers at the tops of the source and drain metal, and a (second) dielectric liner having been formed along the exposed sidewalls of the gate spacers in the second gaps according to an embodiment of the present invention.

As shown in FIG. 7 (a cross-sectional view X1), the source/drain metal 602 is then recessed, forming (second) gaps 702 between the gate spacers 108 at the tops of the source/drain metal 602. By way of example only, a fluorine-based plasma etching process can be used to etch the source/drain metals such as Co and/or Ru selective to the silicon-containing material(s) of gate spacers 108 and the gate metals. A (second) dielectric liner 704 is then formed along the exposed sidewalls of gate spacers 108 in the gaps 702. See FIG. 7. According to an exemplary embodiment, dielectric liner 704 is formed by depositing a dielectric liner material into gaps 702, and then using a directional (anisotropic) etching process to pattern the material into the dielectric liner 704 along the sidewalls of gate spacers 108 in gaps 702. Suitable dielectric liner materials include, but are not limited to, SiO$_2$ and/or SiN. Preferably, a different material is used for dielectric liner 704 than for gate spacers 108. This will enable the removal of the dielectric liner 704 selective to the gate spacers 108 later on in the process. Further, according to an exemplary embodiment, a different material is used for dielectric liner 704 (over source/drain metal 602) than for dielectric liner 304 (over gates 106). For instance, by way of a non-limiting example, SiOCN and/or SiBCN can be used for gate spacers 108, while SiO$_2$ and SiN are used for dielectric liner 304 and dielectric liner 704, respectively (or vice versa).

Figure 8:
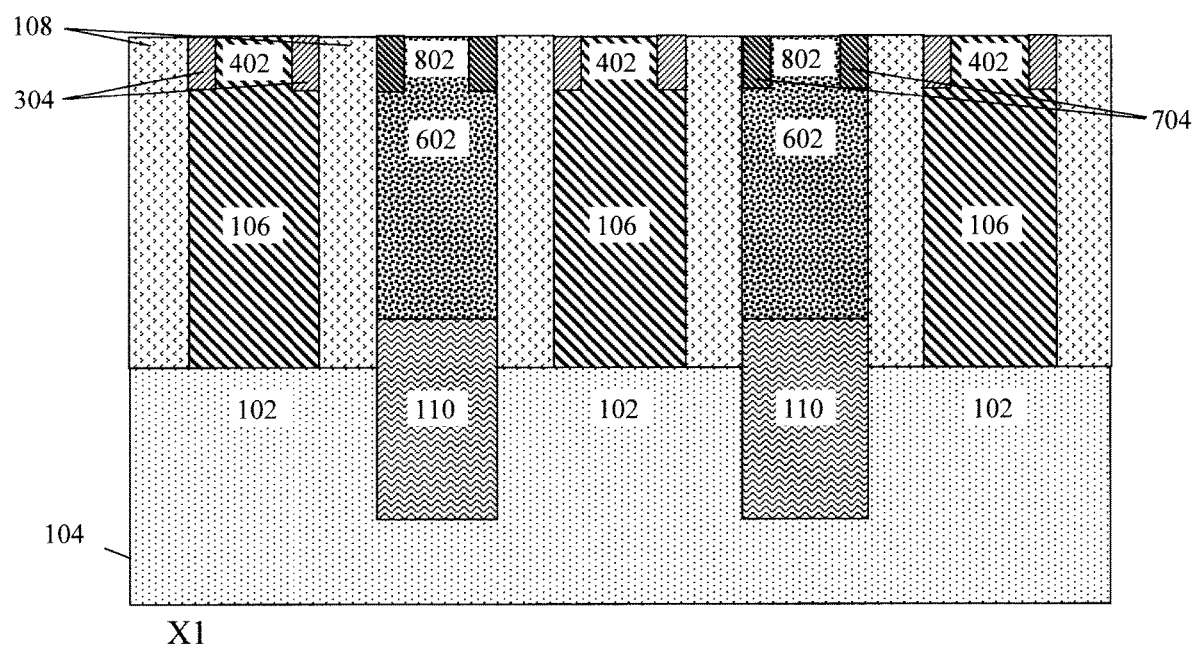
FIG. 8 is a cross-sectional diagram illustrating the second gaps between the second dielectric liner having been filled with (additional) source and drain metal such that the second dielectric liner is now present lining the upper sidewalls of the source and drain metal according to an embodiment of the present invention.

As shown in FIG. 8 (a cross-sectional view X1), the gaps 702 between dielectric liner 704 are then filled with (additional) source/drain metal 802. According to an exemplary embodiment, source/drain metal 802 is the same as source/drain metal 602 (i.e., Co and/or Ru). Source/drain metal 802 can be deposited/grown in gaps 702 using a process such as evaporation, sputtering, electrochemical plating, etc. The overburden is then removed using a process such as CMP. As a result, dielectric liner 704 is now present lining the upper sidewalls of the source/drain metal (formed by source/drain metal 802).

Figure 9:
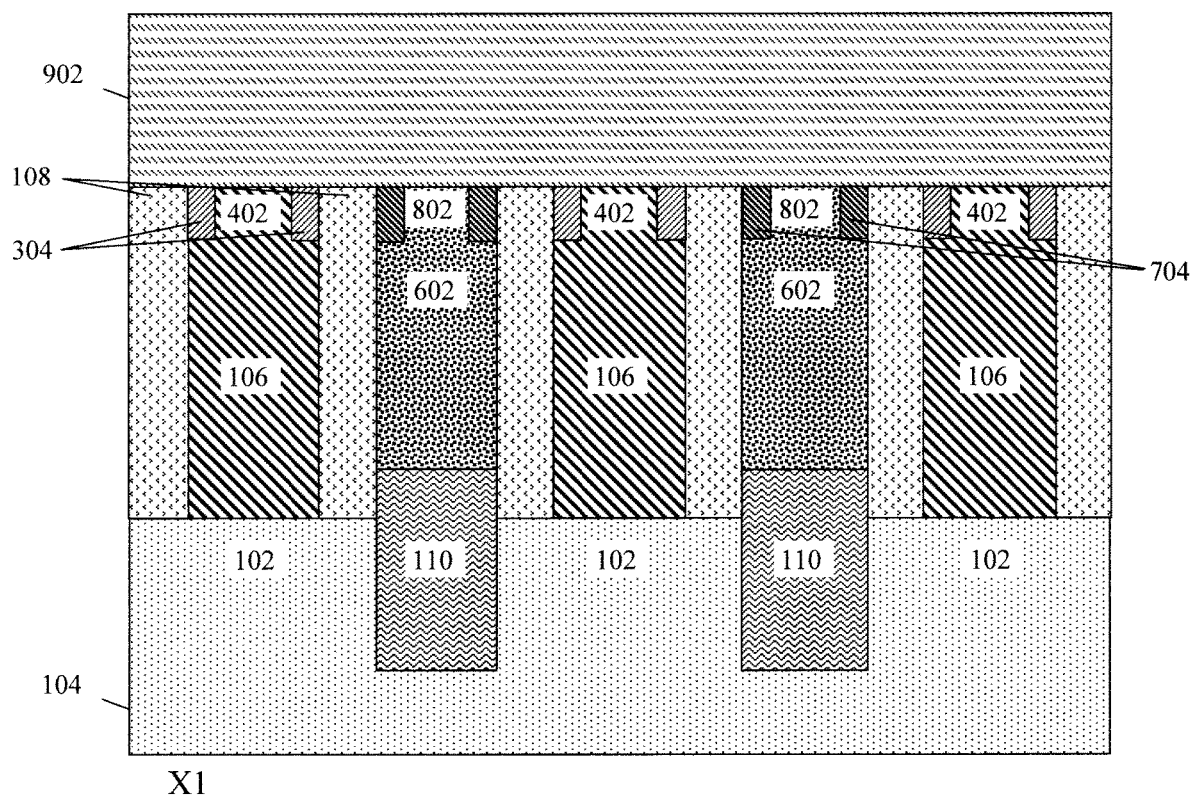
FIG. 9 is a cross-sectional diagram illustrating a middle-of-line (MOL) dielectric having been deposited over the gates/gate metal and source and drain metal according to an embodiment of the present invention.

As shown in FIG. 9 (a cross-sectional view X1), a MOL dielectric 902 is then deposited over gates 106/gate metal 402 and source/drain metal 602/802. Suitable MOL dielectrics 902 include, but are not limited to, SiOx, SiCOH and/or pSiCOH.

Figure 10:
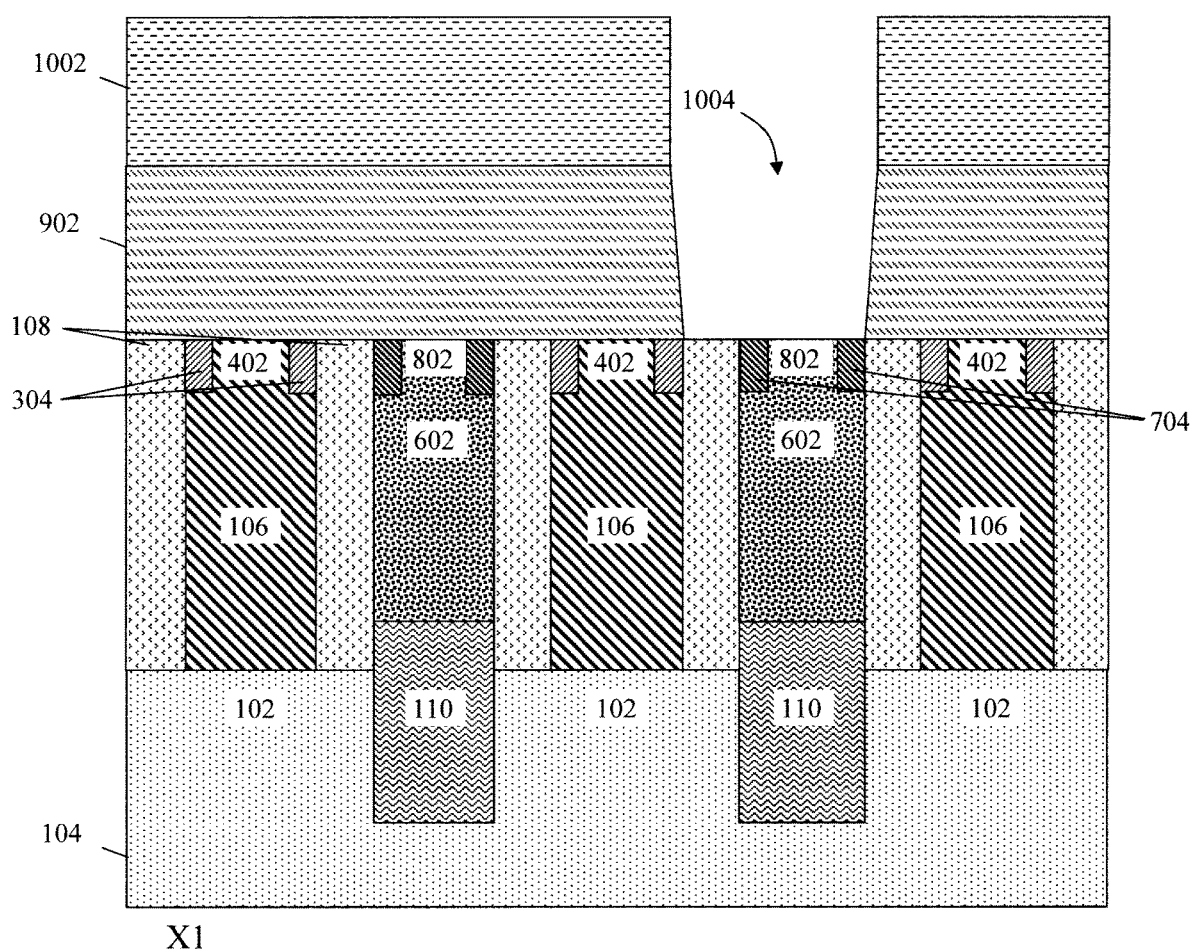
FIG. 10 is a cross-sectional diagram illustrating a mask having been used to form a (first) contact via in the MOL dielectric which exposes the second dielectric liner over a select source and drain according to an embodiment of the present invention.

As shown in FIG. 10 (a cross-sectional view X1), standard lithography and etching techniques are used to pattern a mask 1002 over MOL dielectric 902 marking the footprint and location of a contact via over (a select) one of the source/drains 110. According to an exemplary embodiment, mask 1002 is formed from an OPL material commonly employed in a lithographic stack. A directional (anisotropic) etching process such as RIE is then used to transfer the pattern from mask 1002, forming a (first) contact via 1004 in MOL dielectric 902. See FIG. 10. As shown in FIG. 10, contact via 1004 exposes the dielectric liner 704 over the select source/drains 110.

Figure 11:
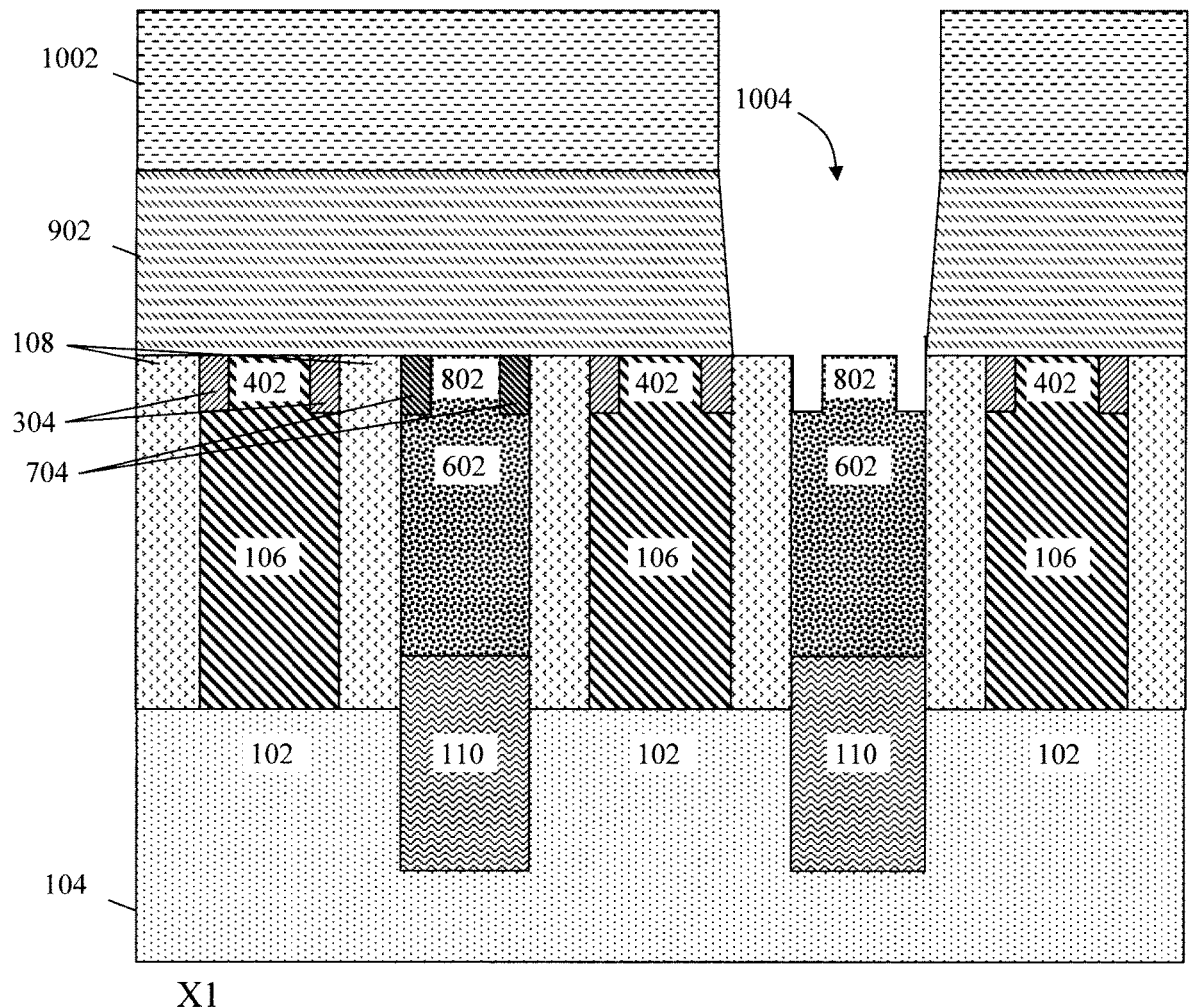
FIG. 11 is a cross-sectional diagram illustrating the second dielectric liner having been removed from the upper sidewalls of the source and drain metal through the first contact via over the select source and drain according to an embodiment of the present invention.

As shown in FIG. 11 (a cross-sectional view X1), dielectric liner 704 is then removed from the upper sidewalls of the source/drain metal through contact via 1004 over the select source/drain 110. Any slight misalignment of contact via 1004 over the select source/drains 110 is inconsequential, even if a portion of the adjacent dielectric liner 304 (over gates 106) is exposed by contact via 1004, since a different material is preferably used for dielectric liner 704 than for dielectric liner 304 (see above).

Figure 12:
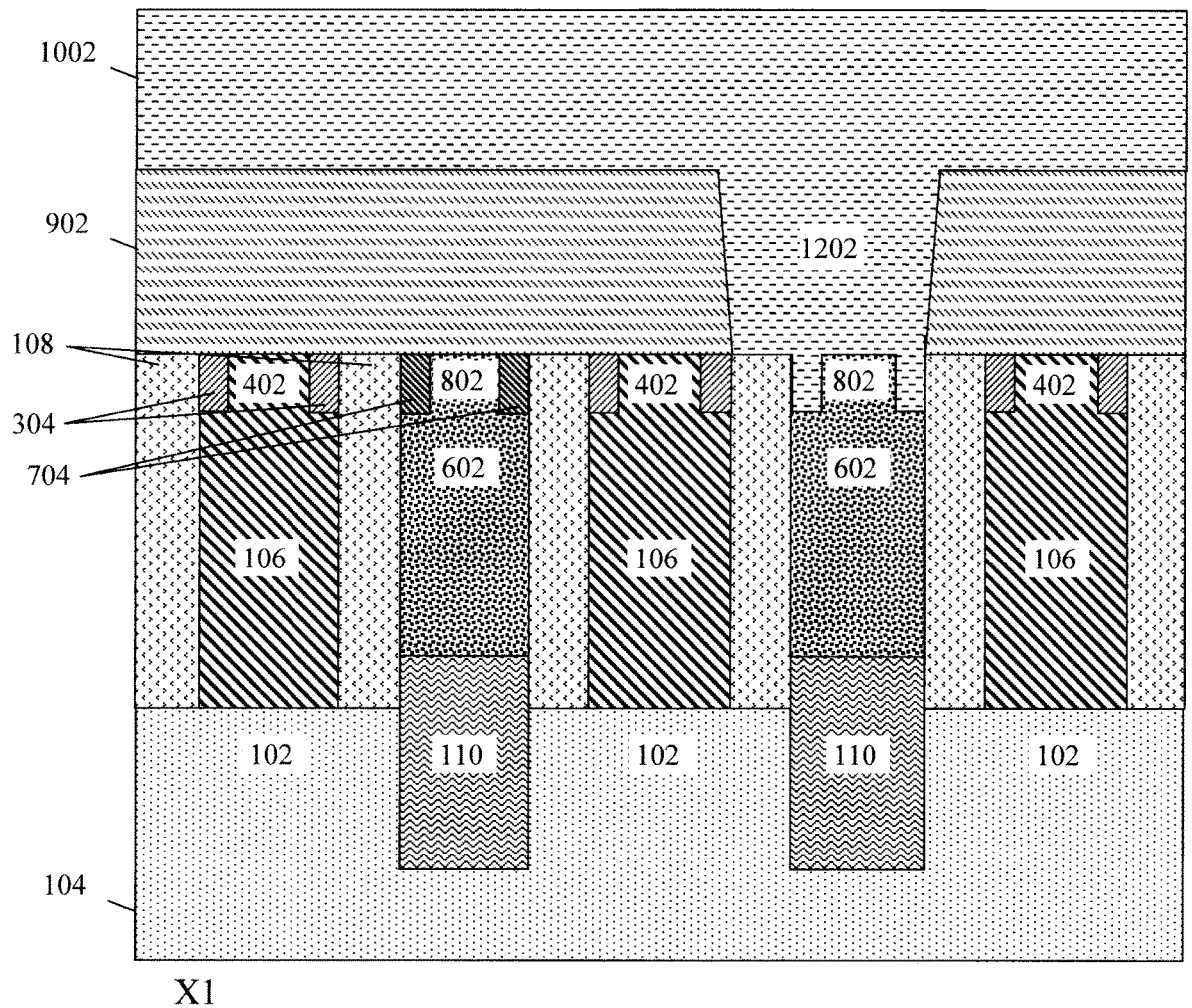
FIG. 12 is a cross-sectional diagram illustrating the first contact via having been temporarily filled with the mask material according to an embodiment of the present invention.

A source/drain contact will be formed in contact via 1004 (see below). First, to enable similar patterning of a gate contact in MOL dielectric 902, as shown in FIG. 12 (a cross-sectional view X1), contact via 1004 is temporarily filled with a mask 1202 (e.g., the same OPL) material. The process is then repeated to pattern a contact via over a (select) one of the gates 106.

Figure 13:
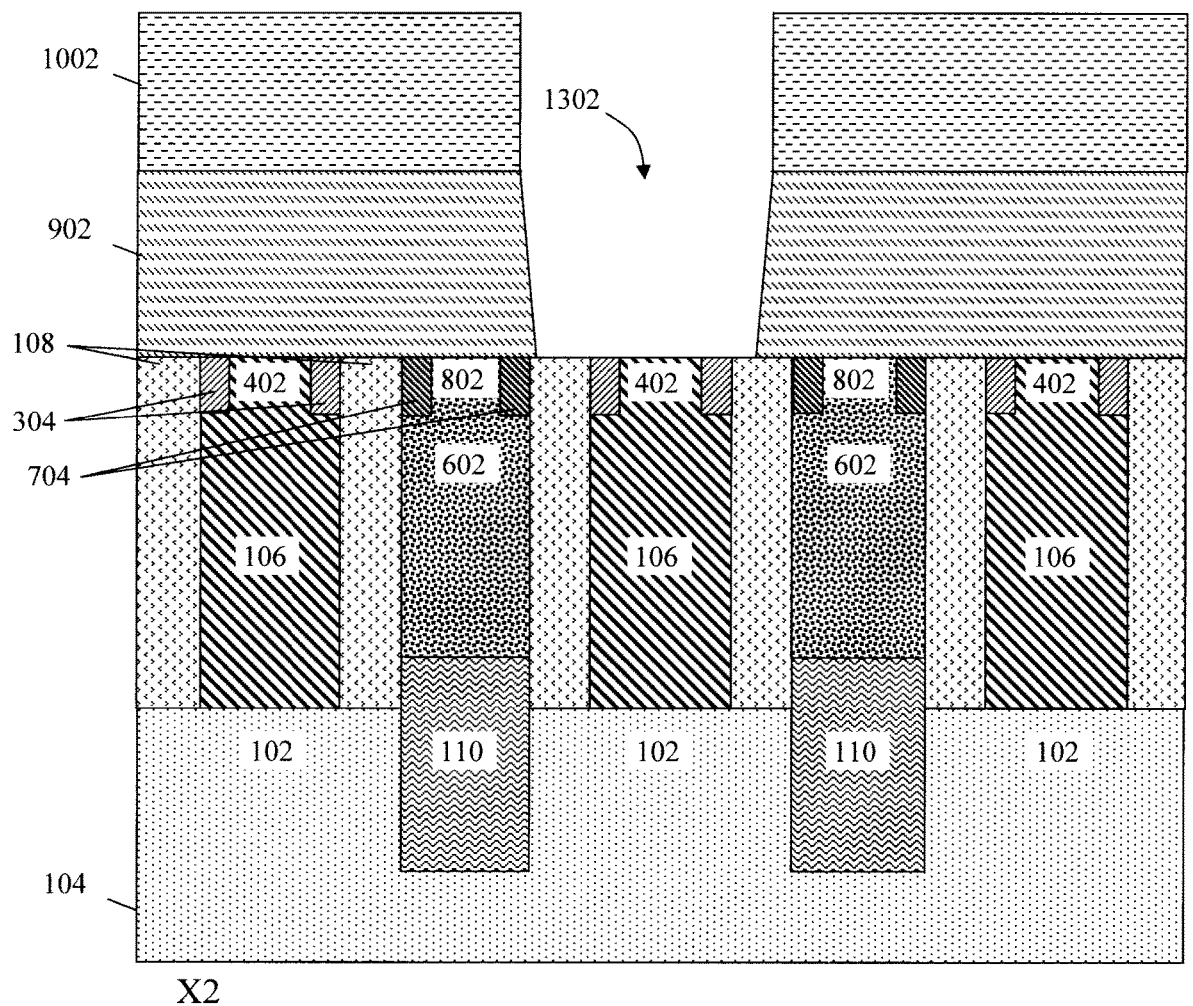
FIG. 13 is a cross-sectional diagram illustrating the mask having been used to form a (second) contact via in the MOL dielectric which exposes the first dielectric liner over a select gate according to an embodiment of the present invention.

Namely, as shown in FIG. 13 (a cross-sectional view X2), standard lithography and etching techniques are used to pattern mask 1002 over MOL dielectric 902 marking the footprint and location of a contact via over a (select) one of the gates 106. A directional (anisotropic) etching process such as RIE is then used to transfer the pattern from mask 1002, forming a (second) contact via 1302 in MOL dielectric 902. See FIG. 13. As shown in FIG. 13, contact via 1302 exposes the dielectric liner 304 over the select gate 106.

Figure 14:
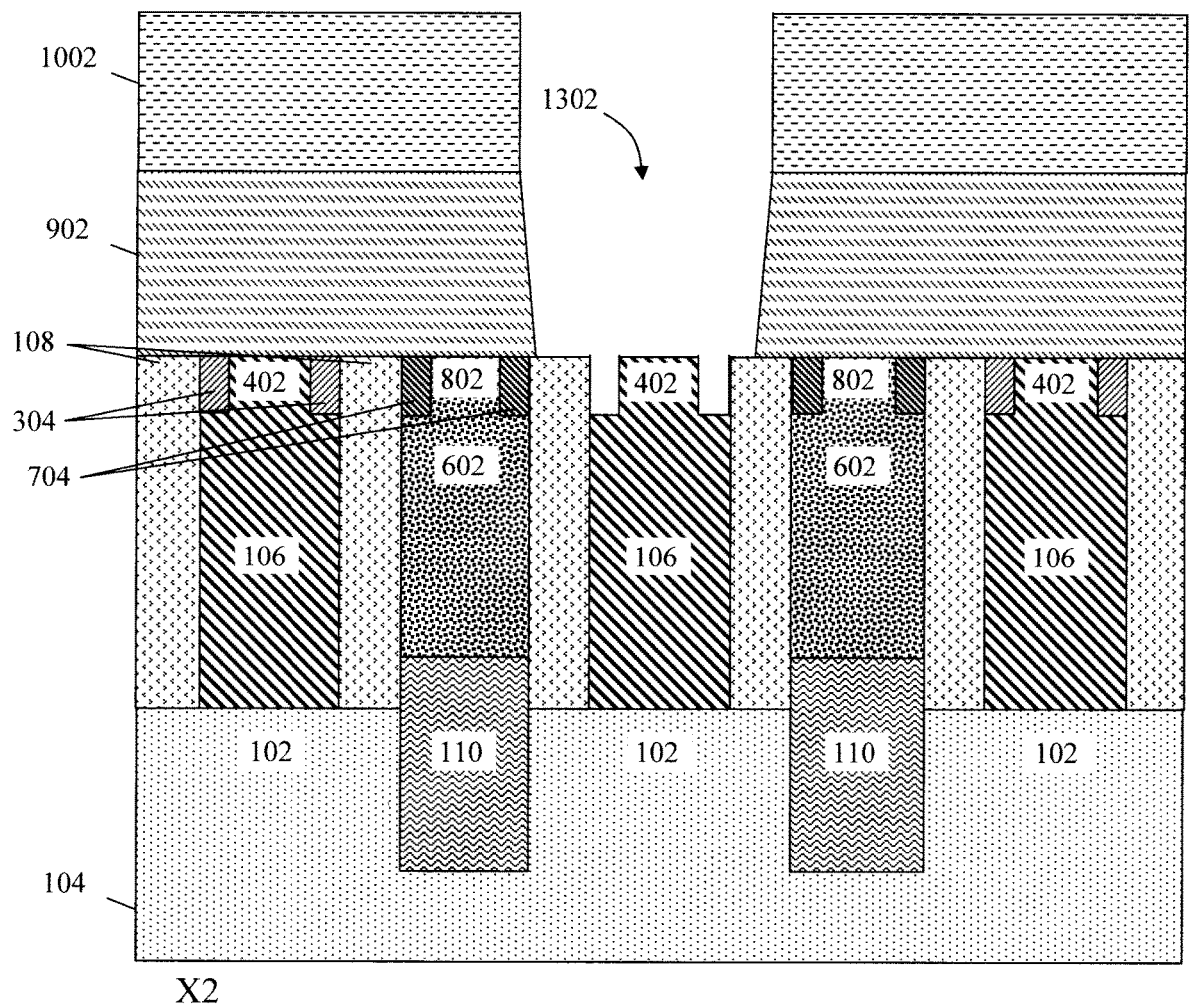
FIG. 14 is a cross-sectional diagram illustrating the first dielectric liner having been removed from the upper sidewalls of the gate through the second contact via over the select gate according to an embodiment of the present invention.

As shown in FIG. 14 (a cross-sectional view X2), dielectric liner 304 is then removed from the upper sidewalls of the select gate 106 through contact via 1302. Any slight misalignment of contact via 1302 over the select gate 106 is inconsequential, even if a portion of the adjacent dielectric liner 704 (over source/drains 110) is exposed by contact via 1302, since a different material is preferably used for dielectric liner 304 than for dielectric liner 704 (see above).

Figure 15:
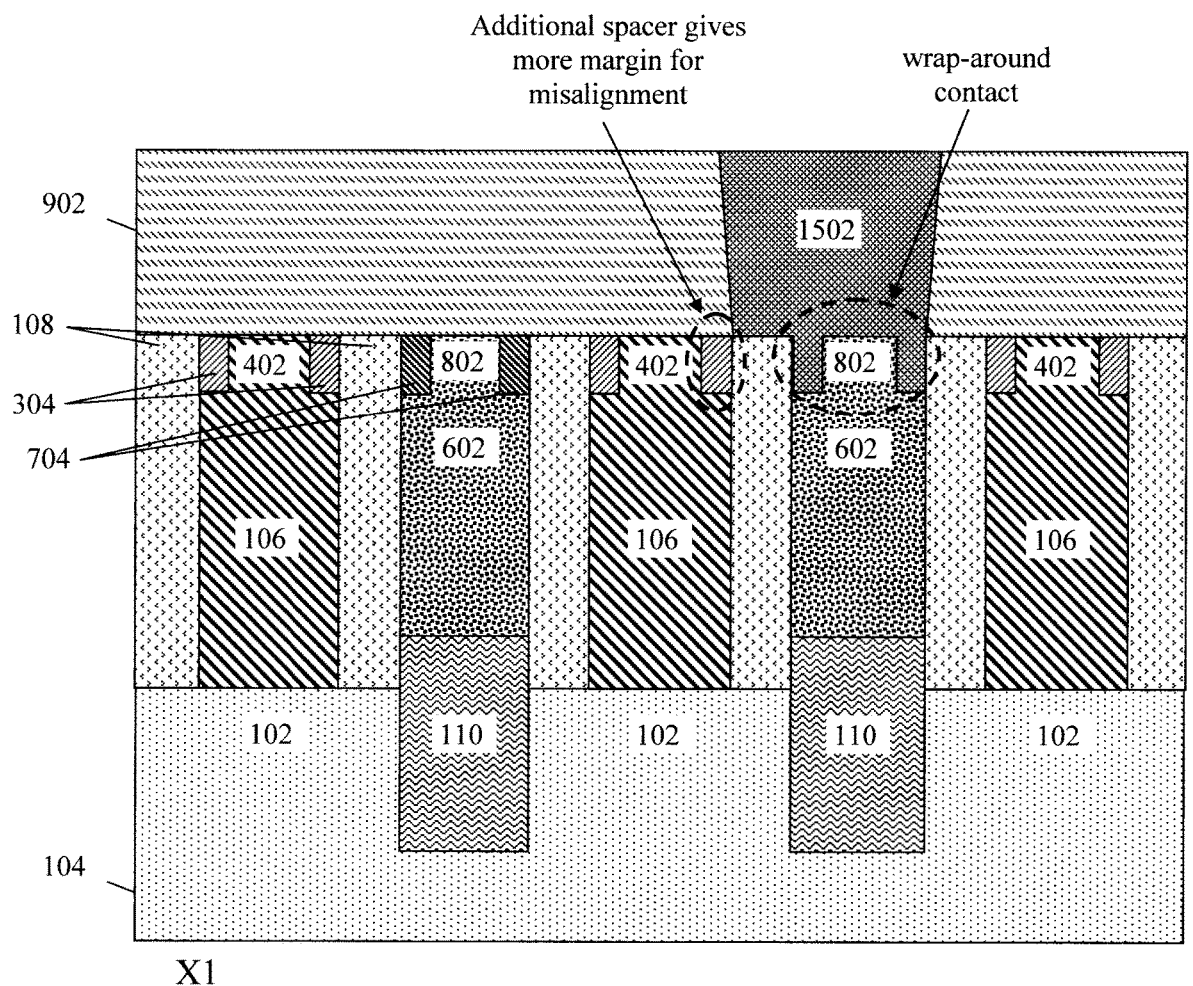
FIG. 15 is a cross-sectional diagram illustrating the mask having been removed, and a source and drain contact having been formed in the first contact via that wraps around a top and upper sidewalls of the source and drain metal over the select source and drain according to an embodiment of the present invention.

Mask 1202 is then removed and, as shown in FIG. 15 (a cross-sectional view X1), a source/drain contact 1502 is formed in contact via 1004. According to an exemplary embodiment, source/drain contact 1502 is formed by depositing a contact metal (e.g., by evaporation, sputtering, etc.) into contact via 1004, and then removing the overburden, e.g., using CMP. Suitable contact metals include, but are not limited to, Cu, Co, Ru and/or W. It is notable that, as shown in FIG. 15, there is an increased contact area between source/drain contact 1502 and the source/drain metal due to the removal of the dielectric liner 704, i.e., source/drain contact 1502 wraps around, and is in direct contact with, a top and upper sidewalls of source/drain metal 802. Further, as provided above, the adjacent dielectric liner 304 gives more of a margin for source/drain contact 1502 misalignment without risk of shorting to the adjacent gate 106.

Figure 16:
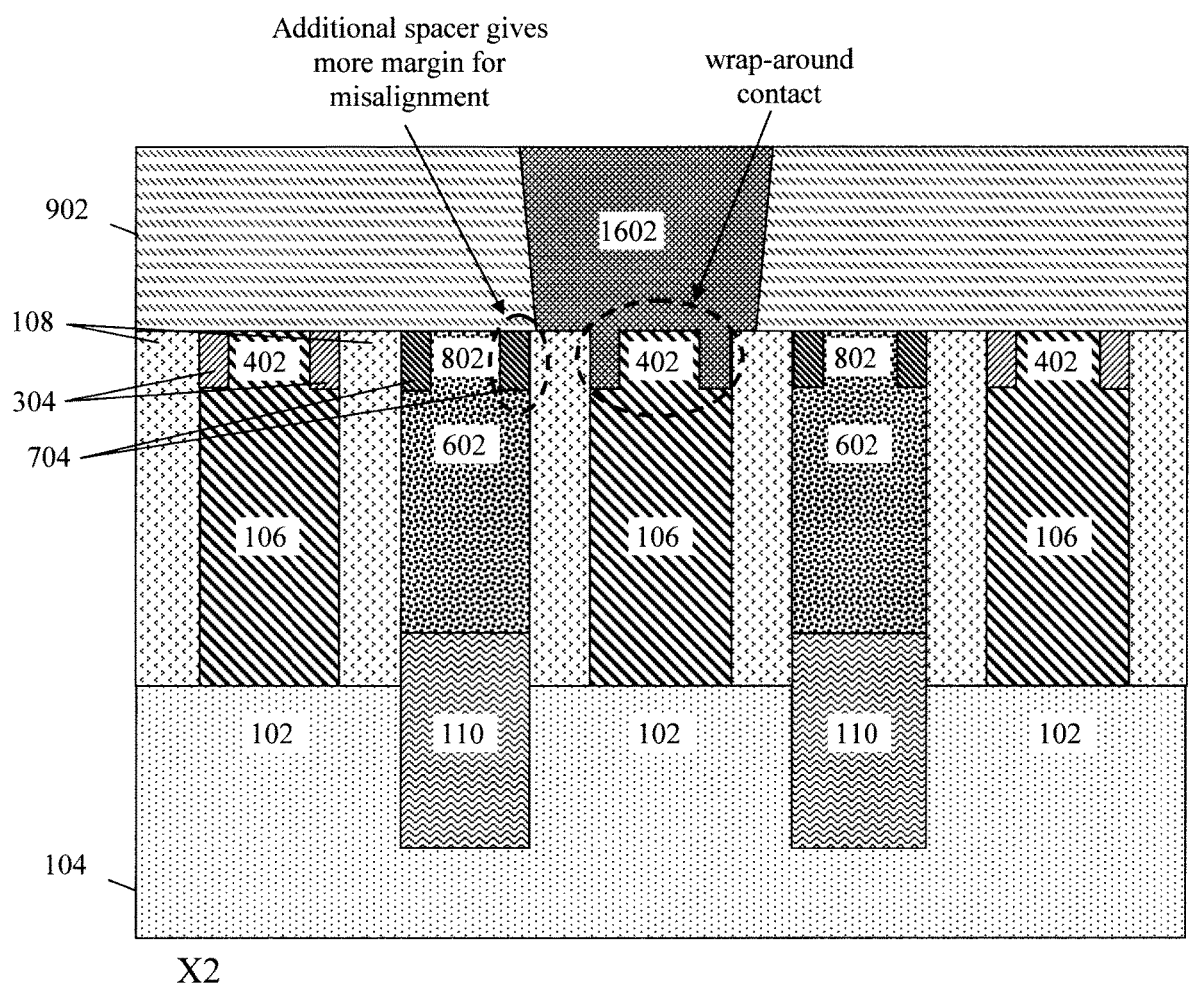
FIG. 16 is a cross-sectional diagram illustrating a gate contact having been formed in the second contact via that wraps around a top and upper sidewalls of the gate metal of the select gate according to an embodiment of the present invention.

As shown in FIG. 16 (a cross-sectional view X2), a gate contact 1602 is also formed in contact via 1302. According to an exemplary embodiment, gate contact 1602 is formed by depositing (e.g., by evaporation, sputtering, etc.) a contact metal (Cu, Co, Ru and/or W) into contact via 1302, and then removing the overburden, e.g., using CMP. As shown in FIG. 16, there is an increased contact area between gate contact 1602 and the gate due to the removal of the dielectric liner 304, i.e., gate contact 1602 wraps around, and is in direct contact with, a top and upper sidewalls of gate metal 402. Further, as provided above, the adjacent dielectric liner 704 gives more of a margin for gate contact 1602 misalignment without risk of shorting to the adjacent source/drain 110. Further, while depicted in separate figures, it is to be understood that one or more steps involved in the formation of source/drain contact 1502 and gate contact 1602 can be performed concurrently.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A semiconductor device, comprising:
fins patterned in a substrate;
gates formed over the fins;
source and drains formed on opposite sides of the gates, offset from the gates by gate spacers;
a source and drain metal disposed over the source and drains;
a first dielectric liner alongside only upper sidewalls of the gates;
a second dielectric liner alongside only upper sidewalls of the source and drain metal;
a dielectric disposed over the gates and the source and drains;
a first contact via in the dielectric over a select source and drain;

a source and drain contact formed in the first contact via, wherein the source and drain contact wraps around the upper sidewalls of the source and drain metal over the select source and drain;

a second contact via in the dielectric over a select gate; and a gate contact formed in the second contact via, wherein the gate contact wraps around the upper sidewalls of the select gate.

2. The semiconductor device of claim 1, wherein the gate spacers comprise a material selected from the group consisting of: $SiO_2$, SiOC, SiN, SiBCN, SiOCN, and combinations thereof.

3. The semiconductor device of claim 1, wherein the first dielectric liner and the second dielectric liner are each formed from a material selected from the group consisting of: $SiO_2$, SiN, and combinations thereof.

4. The semiconductor device of claim 1, wherein the gate spacers, the first dielectric liner, and the second dielectric liner are formed from different materials.

5. The semiconductor device of claim 1, wherein the gates comprise a metal selected from the group consisting of: W, Cu, and combinations thereof.

6. The semiconductor device of claim 1, wherein the source and drain metal is selected from the group consisting of: Co, Ru, and combinations thereof.

7. The semiconductor device of claim 1, wherein the first dielectric liner is disposed between the gate spacers and the upper sidewalls of the gates.

8. The semiconductor device of claim 1, wherein the second dielectric liner is disposed between the gate spacers and the upper sidewalls of the source and drain metal.

* * * * *